United States Patent
Fong (10) Patent No.: US 12,144,265 B2
(45) Date of Patent: *Nov. 12, 2024

(54) TUNABLE JOSEPHSON JUNCTION OSCILLATOR

(71) Applicant: RAYTHEON BBN TECHNOLOGIES CORP., Cambridge, MA (US)

(72) Inventor: Kin Chung Fong, Concord, MA (US)

(73) Assignee: RTX BBN TECHNOLOGIES, INC., Cambridge, MA (US)

( * ) Notice: Subject to any disclaimer, the term of this patent is extended or adjusted under 35 U.S.C. 154(b) by 149 days.

This patent is subject to a terminal disclaimer.

(21) Appl. No.: 17/886,283

(22) Filed: Aug. 11, 2022

(65) Prior Publication Data

US 2022/0393090 A1 Dec. 8, 2022

Related U.S. Application Data (63) Continuation of application No. 17/147,387, filed on Jan. 12, 2021, now Pat. No. 11,430,937.

(51) Int. Cl.
*H10N 60/10* (2023.01)
*H03K 17/92* (2006.01)
*H10N 60/12* (2023.01)
*H10N 60/85* (2023.01)

(52) U.S. Cl.
CPC ........... *H10N 60/128* (2023.02); *H03K 17/92* (2013.01); *H10N 60/12* (2023.02); *H10N 60/855* (2023.02)

(58) Field of Classification Search
CPC .... H10N 60/128; H10N 60/12; H10N 60/855; H03K 17/92
See application file for complete search history.

(56) References Cited

U.S. PATENT DOCUMENTS

| | | | |
|---|---|---|---|
| 9,799,817 B2 | 10/2017 | Fong et al. | |
| 2017/0092834 A1 | 3/2017 | Fong et al. | |
| 2019/0288177 A1 | 9/2019 | Fong et al. | |
| 2020/0274507 A1 | 8/2020 | Fong et al. | |
| 2020/0321508 A1 | 10/2020 | Hart et al. | |
| 2022/0093841 A1 | 3/2022 | Rowlands et al. | |

OTHER PUBLICATIONS

Finnegan, T.F. et al., "Observation of coherent microwave radiation emitted by coupled Josephson junctions", Applied Physics Letters, Dec. 1, 1972, pp. 541-544, vol. 21, No. 11, The American Institute of Physics.

(Continued)

*Primary Examiner* — Matthew L Reames
(74) *Attorney, Agent, or Firm* — CANTOR COLBURN LLP (57) ABSTRACT

A tunable oscillator including a Josephson junction. In some embodiments, the tunable oscillator includes a first superconducting terminal, a second superconducting terminal, a graphene channel including a portion of a graphene sheet, and a conductive gate. The first superconducting terminal, the second superconducting terminal, and the graphene channel together may form a Josephson junction having an oscillation frequency, and the conductive gate may be configured, upon application of a voltage across the conductive gate and the graphene channel, to modify the oscillation frequency.

19 Claims, 5 Drawing Sheets

(56) References Cited

OTHER PUBLICATIONS

International Search Report for corresponding International Application No. PCT/US2021/057775, filed Nov. 2, 2021, International Search Report dated Feb. 7, 2022 and mailed Feb. 18, 2022 (5 pgs.).
Lee, G-H. et al., "Graphene-based Josephson junction microwave bolometer", Nature, Sep. 30, 2020, 13 pages, vol. 586.
Schmidt, et al. "A Ballistic Graphene Superconducting Microwave Circuit," Arxiv.org, Cornell University Library, 201 Olin Library Cornell University Ithaca, NY, Jun. 29, 2018 (43 pgs.).
Shaikhaidarov, R. et al., "Detection of Coherent Terahertz Radiation from a High-Temperature Superconductor Josephson Junction by a Semiconductor Quantum-Dot Detector", Physical Review Applied, 2016, pp. 024010 1 through 024010 6, vol. 5, American Physical Society.
Walsh, E. D. et al., "Graphene-Based Josephson-Junction Single Photon Detector", Physical Review Applied, 2017, pp. 024022 1 through 024022 11, vol. 8, American Physical Society.
Written Opinion of the International Searching Authority for corresponding International Application No. PCT/US2021/057775, filed Nov. 2, 2021, Written Opinion of the International Searching Authority mailed Feb. 18, 2022 (7 pgs.).
JP Office Action for Application No. 2023-541270, mailed Feb. 5, 2024, 5 pages.
Machine Translation of JP Office Action for Application No. 2023-541270, mailed Feb. 5, 2024, 6 pages.

TUNABLE JOSEPHSON JUNCTION OSCILLATOR

CROSS-REFERENCE TO RELATED APPLICATIONS

This application is a continuation of U.S. patent application Ser. No. 17/147,387 filed on Jan. 12, 2021, the entire contents of which are incorporated by reference herein.

FIELD

One or more aspects of embodiments according to the present invention relate to oscillators, and more particularly to a tunable oscillator including a Josephson junction.

BACKGROUND

Microwave and millimeter wave oscillators have a wide range of commercial applications, including applications in cryogenic computing, in which such an oscillator may be used as a signal source or clock.

Thus, there is a need for a microwave or millimeter wave oscillator.

SUMMARY

According to an embodiment of the present disclosure, there is provided a system, including: a first superconducting terminal, a second superconducting terminal, a graphene channel including a portion of a graphene sheet, and a conductive gate, the first superconducting terminal, the second superconducting terminal, and the graphene channel together forming a Josephson junction having an oscillation frequency, and the conductive gate being configured, upon application of a voltage across the conductive gate and the graphene channel, to modify the oscillation frequency.

In some embodiments, a gap between the first superconducting terminal and the second superconducting terminal has a length greater than 100 nm and less than 1000 nm.

In some embodiments, the gap has a width greater than 0.5 microns and less than 10 microns.

In some embodiments, the system further includes a first bias circuit connected to the first superconducting terminal and the second superconducting terminal and configured to drive a bias current through the Josephson junction.

In some embodiments, the Josephson junction has a critical current, and the bias current is greater than the critical current and less than 1.2 times the critical current.

In some embodiments, the system further includes a second bias circuit connected to the conductive gate and configured to apply a voltage to the conductive gate.

In some embodiments, the system further includes a graphene sandwich including: a first layer of hexagonal boron nitride immediately adjacent a first surface of the graphene sheet, the graphene sheet, and a second layer of hexagonal boron nitride immediately adjacent a second surface of the graphene sheet.

In some embodiments, the conductive gate is directly on the graphene sandwich.

In some embodiments, the system further includes a gate insulating layer directly on the graphene sandwich, the conductive gate being directly on the gate insulating layer.

In some embodiments, the gate insulating layer is composed of aluminum oxide.

In some embodiments, the system further includes a substrate, wherein the first superconducting terminal, the second superconducting terminal, and the graphene sandwich are on the substrate.

In some embodiments, the substrate is a silicon substrate.

In some embodiments, the graphene sheet consists of a single atomic layer of graphene.

In some embodiments, the graphene sheet includes two atomic layers of graphene.

In some embodiments, the first superconducting terminal and the second superconducting terminal are composed of a material selected from the group consisting of niobium nitride, niobium titanium nitride, niobium diselenide, aluminum, niobium, niobium titanium, and lead.

In some embodiments, the system further includes a refrigerator configured to cool the graphene sheet to a temperature below 4 K.

In some embodiments, the refrigerator is a pulse tube refrigerator.

In some embodiments, the system further includes an antenna including a first conductor, and a second conductor, wherein: the first superconducting terminal is connected to the first conductor of the antenna, and the second superconducting terminal is connected to the second conductor of the antenna.

In some embodiments, the system further includes a quarter-wave open stub, connected to the first superconducting terminal.

In some embodiments, the system further includes a quarter-wave section of transmission line, connected to the second superconducting terminal.

BRIEF DESCRIPTION OF THE DRAWINGS

Features, aspects, and embodiments are described in conjunction with the attached drawings, in which.

DETAILED DESCRIPTION

The detailed description set forth below in connection with the appended drawings is intended as a description of exemplary embodiments of a tunable oscillator including a Josephson junction provided in accordance with the present disclosure and is not intended to represent the only forms in which embodiments of the present disclosure may be constructed or utilized. The description sets forth the features of the present disclosure in connection with the illustrated embodiments. It is to be understood, however, that the same or equivalent functions and structures may be accomplished by different embodiments that are also intended to be encompassed within the scope of the disclosure. As denoted elsewhere herein, like element numbers are intended to indicate like elements or features.

Figure 1A:
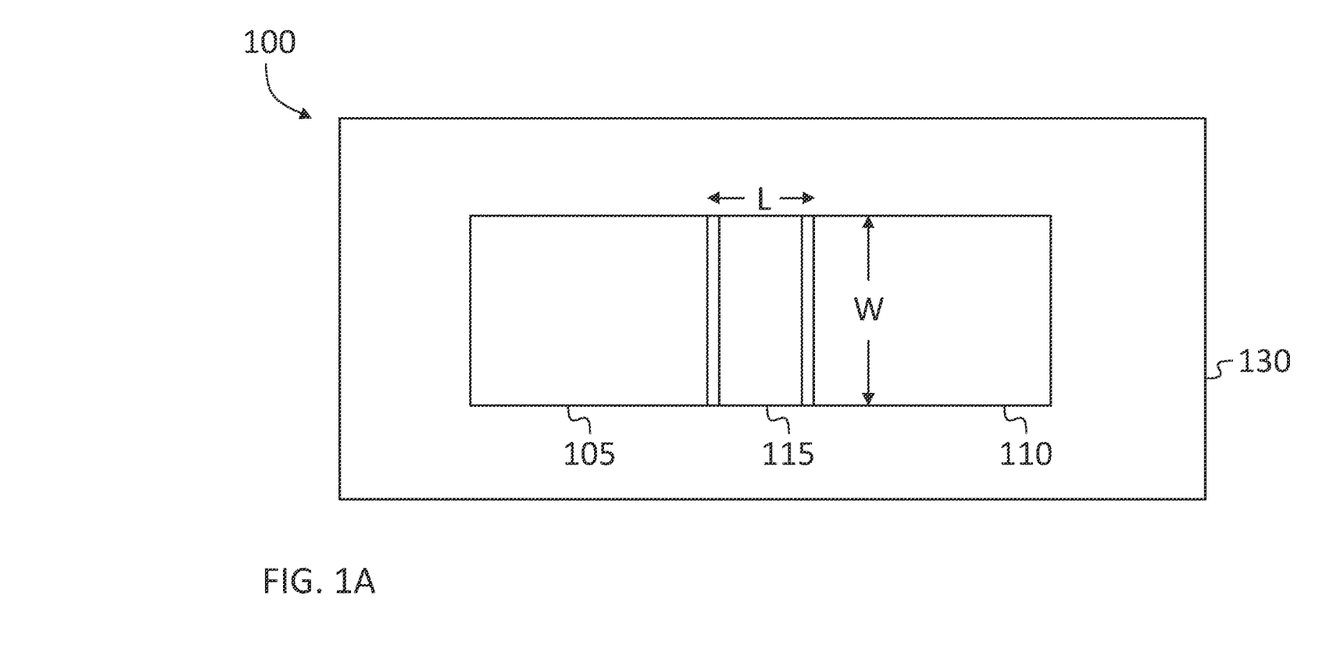
FIG. 1A is a top view of a graphene-based superconducting tunable oscillator, according to an embodiment of the present disclosure.
Figure 1B:
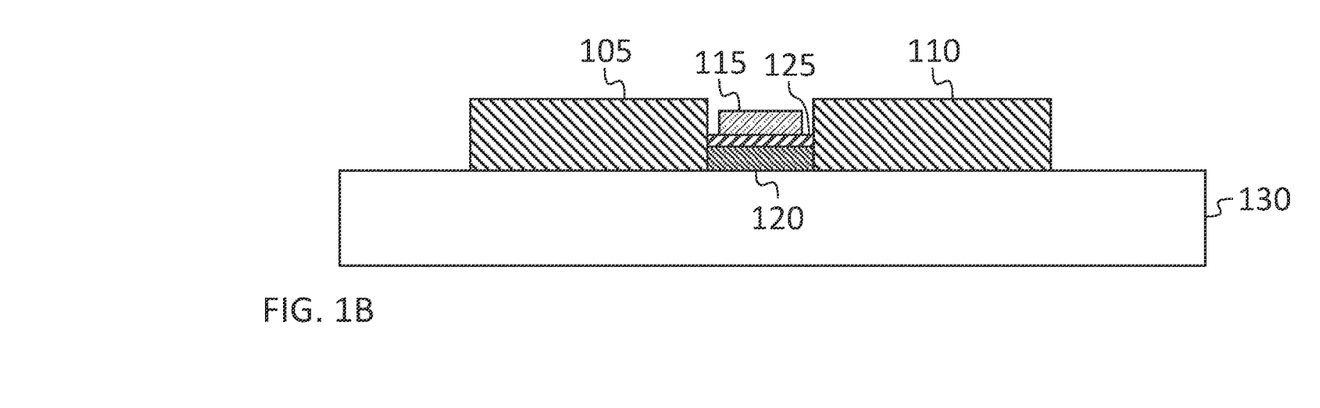
FIG. 1B is a side cross-sectional view of a graphene-based superconducting tunable oscillator, according to an embodiment of the present disclosure.

FIGS. 1A and 1B are a schematic top view and side view of a graphene-based superconducting tunable oscillator 100 according to some embodiments. The graphene-based superconducting tunable oscillator 100 has a first superconducting terminal 105, a second superconducting terminal 110, and a conductive gate 115. As used herein, a "superconducting terminal" is a terminal, of the graphene-based superconducting tunable oscillator 100, composed of a material that behaves as a superconductor under suitable conditions, e.g., at sufficiently low temperature, magnetic field, and current density. As such, the superconducting terminals of the graphene-based superconducting tunable oscillator 100 of FIGS. 1A and 1B may be referred to as superconducting terminals regardless of whether the graphene-based superconducting tunable oscillator 100 is at sufficiently low temperature for these terminals 105, 110 to be superconducting.

The first superconducting terminal 105 and the second superconducting terminal 110 may each be composed of any of a number of materials known in the art that become superconductive at low temperatures, including niobium nitride, niobium titanium nitride, niobium diselenide, molybdenum rhenium alloy, aluminum, niobium, niobium titanium, or lead.

Figure 2:
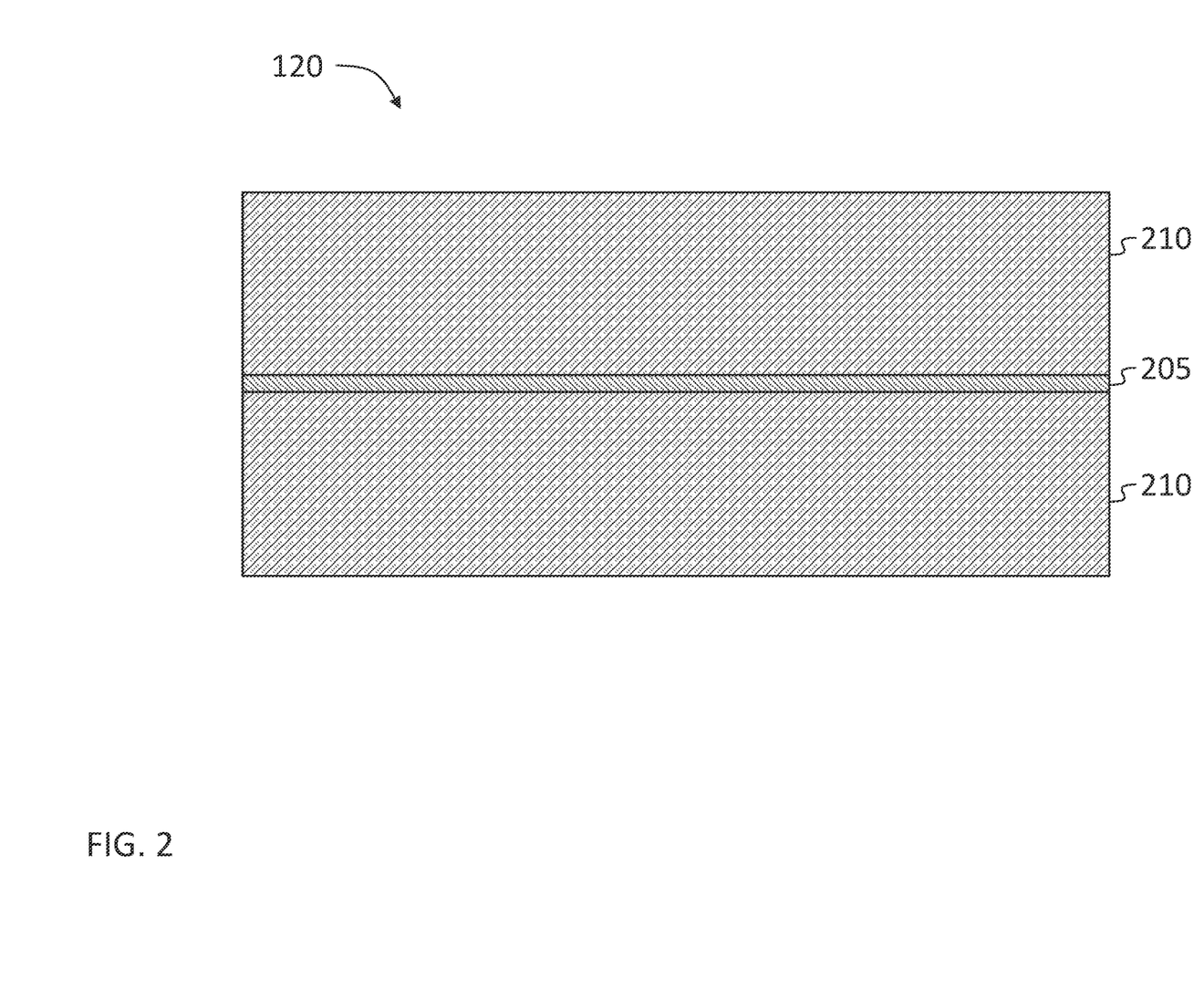
FIG. 2 is a side cross-sectional view of a graphene sandwich, according to an embodiment of the present disclosure.

In some embodiments, a graphene sheet forms a graphene channel of the graphene-based superconducting tunable oscillator 100. As used herein, a "graphene channel" is a graphene sheet, or a portion of a graphene sheet, that forms a conductive path between two superconducting terminals 105, 110 of a graphene-based superconducting tunable oscillator 100. This element may be referred to as a "channel" (and the conductive gate 115 may be referred to as a "gate") in part because in certain respects the behavior of the graphene-based superconducting tunable oscillator 100 may be analogous to the behavior of a field effect transistor (as discussed in further detail below). The conductive path may include one or more gaps, e.g., a gap between each superconducting terminal 105, 110 and the graphene sheet, across which electrons may be conducted by tunneling. The graphene sheet may be part of a graphene sandwich 120, an enlarged view of a portion of which is shown in FIG. 2. The graphene sandwich 120 may include the graphene sheet 205, between two insulating layers 210, e.g., between two layers of hexagonal boron nitride. The graphene sheet 205 may consist of one, two, three, four, or as many as ten atomic layers of graphene. Each layer 210 of hexagonal boron nitride may be between 0.3 nm and 100 nm thick; the layers 210 of hexagonal boron nitride may keep the surface of the graphene sheet 205 clean, i.e., they may prevent surface contamination from compromising the properties of the graphene sheet 205.

Each hexagonal boron nitride layer 210 may be a single crystal, with an atomically flat surface facing the graphene sheet 205. Each hexagonal boron nitride layer 210 may be annealed, e.g., at 250° C. for 10-15 minutes, before the sandwich is assembled. The sandwich may be formed by first bringing a first layer 210 of hexagonal boron nitride into contact with the graphene sheet 205, resulting in adhesion of the graphene sheet 205 to the hexagonal boron nitride by van der Waals forces, and then bringing the graphene sheet 205, on the first layer 210 of hexagonal boron nitride, into contact with the second layer 210 of hexagonal boron nitride, resulting in adhesion, again by van der Waals forces, at the interface between the graphene sheet 205 and the second layer 210 of hexagonal boron nitride. The edges of the sandwich may then be etched, e.g. using plasma etching, so that in the structure remaining after the etch process the edges of the two layers 210 of hexagonal boron nitride and the edges of the graphene sheet 205 coincide (i.e., are aligned). In some embodiments, the graphene sheet is kept sufficiently clean during fabrication of the graphene sandwich 120, and thereafter by the protective layers 210 of hexagonal boron nitride, that the graphene sheet has an electron mobility of more than 100,000 $cm^2/V/s$.

In some embodiments the first superconducting terminal 105 and the second superconducting terminal 110 make contact with respective (e.g., opposite) edges of the graphene sheet 205 by abutting against respective edges of the graphene sandwich 120 as shown, or, in other embodiments, by extending up onto the top surface of the graphene sandwich 120 (e.g., by being deposited, onto the graphene sandwich 120, as a patch extending across the edge of the graphene sandwich 120) so that respective vertical or steeply inclined portions, of the first superconducting terminal 105 and of the second superconducting terminal 110, are (i) in contact with an edge of the graphene sheet 205 or (ii) in sufficiently close proximity with the graphene sheet 205 that electrons may be conducted between the graphene sheet 205 and the first superconducting terminal 105, and between the graphene sheet 205 and the second superconducting terminal 110, by tunneling across respective gaps between the graphene sheet 205 and the first superconducting terminal 105, and between the graphene sheet 205 and the second superconducting terminal 110.

Referring again to FIG. 1B, in some embodiments, a gate insulating layer 125, e.g., a layer of aluminum oxide or of hafnium oxide, or an additional, separately formed, layer of hexagonal boron nitride, may be between the conductive gate 115 and the graphene sandwich 120.

The graphene-based superconducting tunable oscillator 100 of FIGS. 1A and 1B is formed, in some embodiments, by placing the graphene sandwich 120 on a substrate 130, depositing the first superconducting terminal 105 and the second superconducting terminal 110 on the substrate 130 (and onto the graphene sandwich 120, if they overlap onto the graphene sandwich 120), depositing the gate insulating layer 125 (if it is present) on the graphene sandwich 120, and depositing the conductive gate 115 onto the gate insulating layer 125 (or, if the gate insulating layer 125 is absent, directly onto the graphene sandwich 120).

Contacts to external circuitry may be formed, for example, by forming wire bonds to the first superconducting terminal 105, to the second superconducting terminal 110 and to the conductive gate 115. In some embodiments, the deposition steps are performed in a different order, to similar effect.

In some embodiments a plurality of graphene-based superconducting tunable oscillators 100, or one or more graphene-based superconducting tunable oscillators 100 and one or more other elements, may be fabricated on a single substrate 130. The substrate 130 may be a silicon substrate 130, and it may be selected for low conductivity, to reduce interactions between the active elements of the graphene-based superconducting tunable oscillator 100 and the substrate 130. The substrate may be composed, for example, of highly resistive crystalline silicon having a low doping level, such as float zone silicon. The graphene-based superconducting tunable oscillator 100 may be operated at a cryogenic temperature. In one embodiment, the graphene-based superconducting tunable oscillator 100 is cooled to 4 K, using, for example, a pulse tube refrigerator or a Gifford- McMahon (GM) cooler. In other embodiments direct cooling with liquid helium, or with liquid helium in a partial vacuum (e.g., using a 1 K pot, to reach temperatures below 4 K) may be used to cool the graphene-based superconducting tunable oscillator 100.

In operation (e.g., at a temperature of between 0.01 K and 5 K), the graphene-based superconducting tunable oscillator 100 may behave, when the conductive gate 115 is at the same potential, or at substantially the same potential, as the first superconducting terminal 105 and as the second superconducting terminal 110, as a Josephson junction 135, forming a superconducting connection (with no voltage drop) between the first superconducting terminal 105 and the second superconducting terminal 110 when the current flowing between the first superconducting terminal 105 and the second superconducting terminal 110 is less than a critical current of the Josephson junction, and forming a normal connection between the first superconducting terminal 105 and the second superconducting terminal 110 when the current exceeds the critical current of the Josephson junction.

When the current exceeds the critical current of the Josephson junction, the normal connection between the first superconducting terminal 105 and the second superconducting terminal 110 may have a resistance (that may be referred to as the "normal state resistance" ($R_n$)), and a corresponding voltage drop may be present across the first superconducting terminal 105 and the second superconducting terminal 110. The DC voltage drop across the first superconducting terminal 105 and the second superconducting terminal 110 may be equal to the product of (i) the normal state resistance and (ii) the DC current flowing between the first superconducting terminal 105 and the second superconducting terminal 110.

In operation, a voltage may be applied to the conductive gate 115 of the graphene-based superconducting tunable oscillator 100, affecting the current flowing between the first superconducting terminal 105 and the second superconducting terminal 110, or the DC voltage across the first superconducting terminal 105 and the second superconducting terminal 110, or both, depending on the external circuit connected to the first superconducting terminal 105 and the second superconducting terminal 110.

A change in the voltage applied to the conductive gate 115 may alter the Fermi level for electrons within the band structure of the graphene sheet, and accordingly the normal state resistance of the graphene-based superconducting tunable oscillator 100 may vary as a function of the voltage across the conductive gate 115 and the graphene channel. As used herein, the "potential of the graphene channel" is defined to be the average of (i) the potential of the first superconducting terminal 105 at the junction between the first superconducting terminal 105 and the graphene sheet 205, and (ii) the potential of the second superconducting terminal 110 at the junction between the second superconducting terminal 110 and the graphene sheet 205. As used herein, the "voltage across the conductive gate 115 and the graphene channel" is defined to be the difference between the potential of the conductive gate 115 and the potential of the graphene channel.

The critical current of the Josephson junction may decrease as the difference between the potential of the conductive gate 115 and the potential of the graphene channel (i.e., the result of subtracting the potential of the graphene channel from the potential of the conductive gate 115) is decreased, reaching a value of nearly zero when the difference between the potential of the conductive gate 115 and the potential of the graphene channel reaches a value of about −5 V.

The normal state resistance of the graphene-based superconducting tunable oscillator 100 may also be a function of the voltage across the conductive gate 115 and the graphene channel. For example, the normal state resistance may increase as the difference between the potential of the conductive gate 115 and the potential of the graphene channel is decreased, reaching a peak of about 650 ohms when the difference between the potential of the conductive gate 115 and the potential of the graphene channel reaches a value of about −5 V.

In some embodiments, the distance L between the superconductors (FIG. 1A) (or the "channel length" of the Josephson junction 135 or the length of the "gap" between the first superconducting terminal 105 and the second superconducting terminal 110) is about 200 nm (e.g., it is between 100 nm and 1000 nm) and the channel width W (or the width of the gap between the first superconducting terminal 105 and the second superconducting terminal 110) is about 1.5 microns (e.g., it is between 0.5 microns and 10 microns). Increasing or decreasing the channel width may result in the critical current increasing or decreasing by about the same fraction, and may result in the normal-state conductance (the reciprocal of the normal state resistance) increasing or decreasing by about the same fraction. For example, doubling the channel width from 1.5 microns to 3.0 microns (while maintaining the channel length unchanged) may result in a normal state resistance, when the voltage across the conductive gate 115 and the graphene channel is −5 V, of about 325 ohms, and a critical current, when the voltage across the conductive gate 115 and the graphene channel is +5 V, of about 3.4 microamperes.

Both the dependence of the critical current on the gate voltage and the dependence of the channel resistance on the gate voltage may tend to (i) decrease the DC current flowing between the first superconducting terminal 105 and the second superconducting terminal 110 (for a fixed DC voltage across the superconducting terminals 105, 110) or to (ii) increase the DC voltage across the superconducting terminals 105, 110 (for fixed DC current flowing between the first superconducting terminal 105 and the second superconducting terminal 110) as the difference between the potential of the conductive gate 115 and the potential of the graphene channel is decreased. As such, the structure of FIGS. 1A and 1B may, in some embodiments, be employed as a switch (e.g., in a binary logic circuit), with an "on" state in which the difference between the potential of the conductive gate 115 and the potential of the graphene channel is relatively high (e.g., greater than 0 V or greater than +5 V), and an "off" state in which the difference between the potential of the conductive gate 115 and the potential of the graphene channel is relatively low (e.g., less than −5 V).

The structure of FIGS. 1A and 1B may also operate as a tunable oscillator. To operate the structure of FIGS. 1A and 1B as an oscillator, the graphene-based superconducting tunable oscillator 100 may be biased with a substantially constant current, adjusted to be slightly greater than the critical current of the Josephson junction 135 (e.g., greater than the critical current and less than 1.2 times the critical current) so that the Josephson junction is barely in the normal state. This may be accomplished by gradually increasing the bias current until a voltage begins to appear across the superconducting terminals 105, 110. Using this process, the bias current may be set to a value between 10 nA and 1 mA. At this bias point, the Josephson junction may generate an oscillating voltage with an oscillation frequency equal to:

$$f = \frac{2eV_{JJ}}{nh},$$

where e is the electron charge, n is a mode index (which may be equal to 1), h is Planck's constant, and $V_{JJ}$ is the DC voltage across the superconducting terminals 105, 110. It may be seen from the above equation that the oscillation frequency is proportional to $V_{JJ}$, the DC voltage across the superconducting terminals 105, 110. Because of this, and because (as mentioned above) the voltage $V_{JJ}$ across the superconducting terminals 105, 110 may depend on the gate voltage, the frequency of oscillation of the graphene-based superconducting tunable oscillator 100 may be tuned by adjusting the gate voltage. For example, at a gate voltage of −5 V, the oscillation frequency may be about 24 GHz, and at a gate voltage of 0 V, the oscillation frequency may be about 100 GHz. In some embodiments, the gate voltage may be adjusted over a range extending from −50 V to 50 V.

Figure 3:
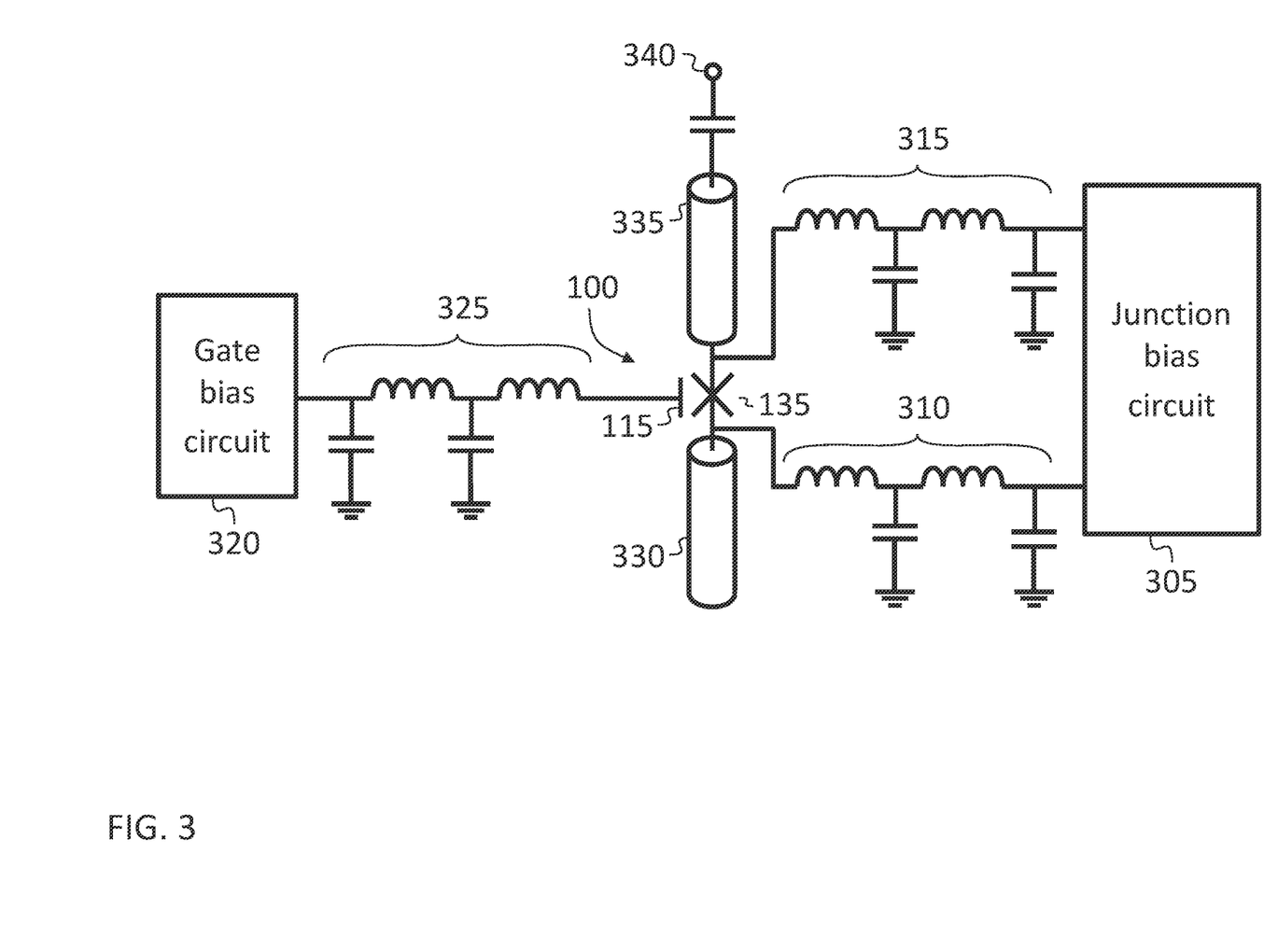
FIG. 3 is a schematic diagram of a circuit using a graphene-based superconducting tunable oscillator, according to an embodiment of the present disclosure.

FIG. 3 shows a circuit including a graphene-based superconducting tunable oscillator 100. A junction bias circuit 305, which may be a current source, is configured to drive a DC bias current through a first bias network (or "bias tee") 310 (connected to the first superconducting terminal 105 (not separately illustrated in FIG. 3)), through the Josephson junction 135, and through a second bias network 315 (connected to the second superconducting terminal 110 (not separately illustrated in FIG. 3)). A gate bias circuit 320 is connected, through a third bias network 325 to the conductive gate 115 of the graphene-based superconducting tunable oscillator 100. The gate bias circuit may include a processing circuit for determining the gate voltage to be applied to the conductive gate 115, and a digital to analog converter for generating the analog gate voltage. In some embodiments, the gate bias circuit may be connected to a frequency reference, and it may include a phase-locked loop circuit for locking the phase and frequency of the graphene-based superconducting tunable oscillator 100 to the frequency reference. Each of the bias networks 305, 310, 325 may include one or more series inductors and one or more shunt capacitors, as shown, or it may include other circuit elements (including, e.g., transmission line elements) performing the function of passing DC while blocking radio frequency (RF) signals (e.g., blocking microwaves or millimeter waves). As used herein, the term "RF" includes frequencies in the range from 100 MHz to 1,000 GHz (e.g., "RF" includes microwaves and millimeter waves).

A section of transmission line, which may be a quarter-wave open stub (e.g., a transmission line having a first end connected to the first superconducting terminal 105 and an open second end) forms an RF ground at the first superconducting terminal 105. A second section of transmission line 335 may be used as an impedance matching element between the graphene-based superconducting tunable oscillator 100 and a load (e.g., a 50 ohm load) that may be connected to the output 340 of the circuit (e.g., the second section of transmission line 335 may be a quarter-wave section of transmission line having a characteristic impedance that is the geometric mean of (i) the output impedance of the graphene-based superconducting tunable oscillator 100 and (ii) the input impedance of the load). One or both of the first section of transmission line 330 and the second section of transmission line 335 may be a section of microstrip transmission line.

Figure 4A:
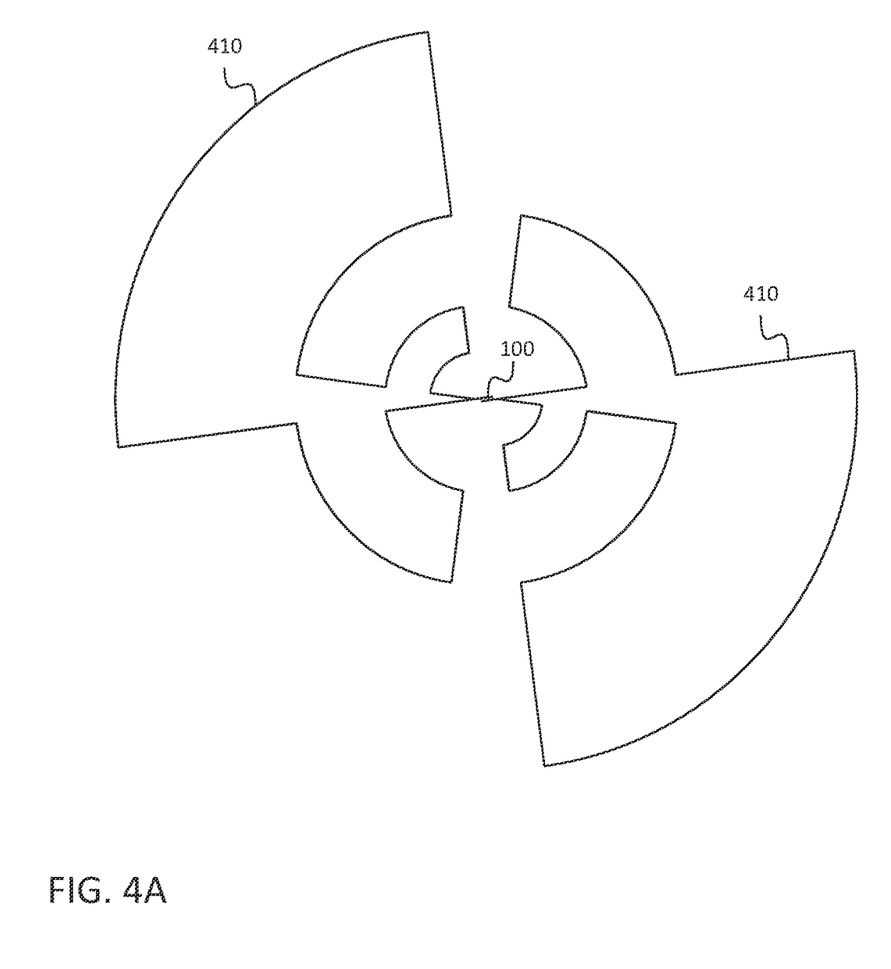
FIG. 4A is a top view of a graphene-based superconducting tunable oscillator coupled to a log-periodic antenna, according to an embodiment of the present disclosure.
Figure 4B:
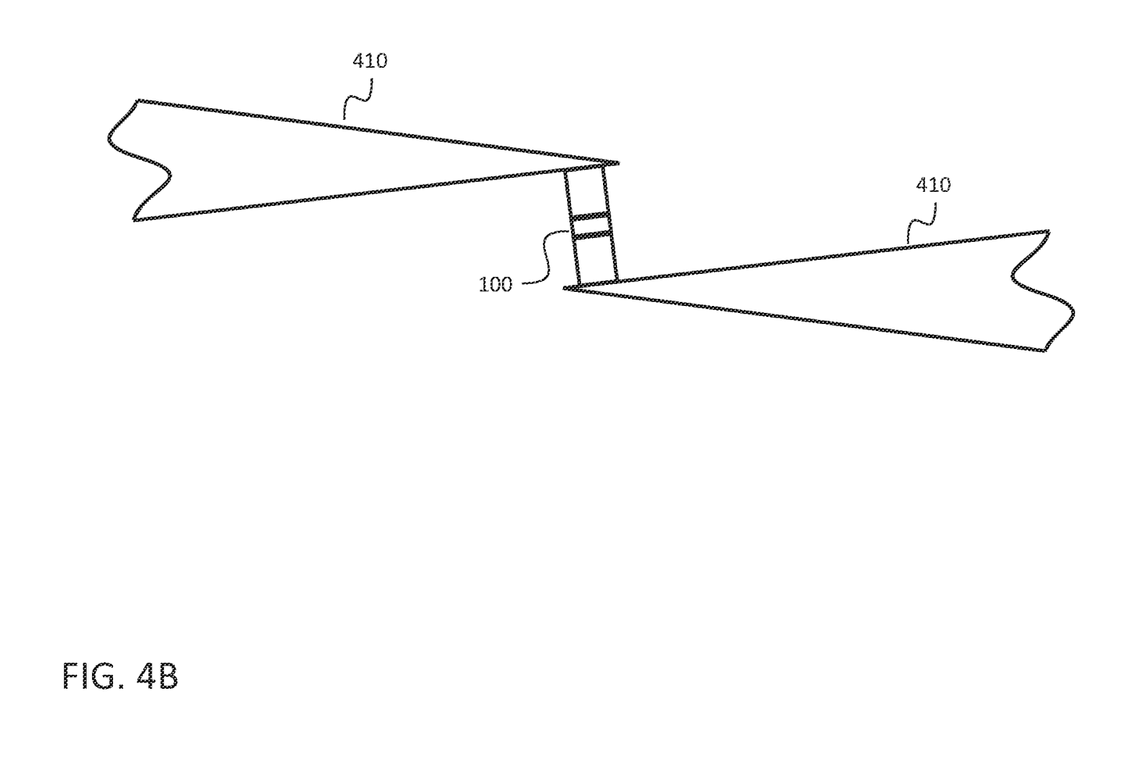
FIG. 4B is an enlarged cutaway view of a central portion of FIG. 4A.

In some embodiments the two superconducting terminals 105, 110 of the graphene-based superconducting tunable oscillator 100 may be configured to drive a differential load. For example, as shown in FIGS. 4A and 4B, the graphene-based superconducting tunable oscillator 100 is connected to the inner ends of two conductive patches 410 of a log periodic antenna. The log periodic antenna may be used to couple the microwave or millimeter wave signal generated by the graphene-based superconducting tunable oscillator 100 to electromagnetic radiation propagating in free space. Referring to FIG. 4B, which is an enlarged view of a central portion of FIG. 4A, the two conductive patches 410 may extend, at the center of the log periodic antenna, along two opposing sides of a rectangular graphene-based superconducting tunable oscillator 100, such as that of FIGS. 1A and 1B. The embodiment of FIGS. 4A and 4B may include additional circuitry (not shown in FIGS. 4A, and 4B) including the bias networks 305, 310, 325, the junction bias circuit 305, and the gate bias circuit 320. The embodiment of FIGS. 4A and 4B may be suitable for radiating electromagnetic radiation in a frequency range extending from about 100 GHz to about 1,000 GHz.

As used herein, "a portion of" something means "at least some of" the thing, and as such may mean less than all of, or all of, the thing. As such, "a portion of" a thing includes the entire thing as a special case, i.e., the entire thing is an example of a portion of the thing. As used herein, the term "rectangle" includes a square as a special case, i.e., a square is an example of a rectangle, and the term "rectangular" encompasses the adjective "square". As used herein, when a second number is "within Y %" of a first number, it means that the second number is at least (1−Y/100) times the first number and the second number is at most (1+Y/100) times the first number. As used herein, the word "or" is inclusive, so that, for example, "A or B" means any one of (i) A, (ii) B, and (iii) A and B.

The term "processing circuit" is used herein to mean any combination of hardware, firmware, and software, employed to process data or digital signals. Processing circuit hardware may include, for example, application specific integrated circuits (ASICs), general purpose or special purpose central processing units (CPUs), digital signal processors (DSPs), graphics processing units (GPUs), and programmable logic devices such as field programmable gate arrays (FPGAs). In a processing circuit, as used herein, each function is performed either by hardware configured, i.e., hard-wired, to perform that function, or by more general-purpose hardware, such as a CPU, configured to execute instructions stored in a non-transitory storage medium. A processing circuit may be fabricated on a single printed circuit board (PCB) or distributed over several interconnected PCBs. A processing circuit may contain other processing circuits; for example, a processing circuit may include two processing circuits, an FPGA and a CPU, interconnected on a PCB.

As used herein, the term "major component" refers to a component that is present in a composition, polymer, or product in an amount greater than an amount of any other single component in the composition or product. In contrast, the term "primary component" refers to a component that makes up at least 50% by weight or more of the composition, polymer, or product. As used herein, any structure or layer that is described as being "made of" or "composed of" a substance should be understood (i) in some embodiments, to contain that substance as the primary component or (ii) in some embodiments, to contain that substance as the major component.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present. As used herein, "generally connected" means connected by an electrical path that may contain arbitrary intervening elements, including intervening elements the presence of which qualitatively changes the behavior of the circuit. As used herein, "connected" means (i) "directly connected" or (ii) connected with intervening elements, the intervening elements being ones (e.g., low-value resistors or inductors, or short sections of transmission line) that do not qualitatively alter the behavior of the circuit.

Although limited embodiments of a tunable oscillator including a Josephson junction have been specifically described and illustrated herein, many modifications and variations will be apparent to those skilled in the art. Accordingly, it is to be understood that a tunable oscillator including a Josephson junction employed according to principles of this disclosure may be embodied other than as specifically described herein without departing from the scope of the following claims.

What is claimed is:

1. A tunable oscillator comprising:
   a first superconducting terminal;
   a second superconducting terminal;
   a graphene channel between the first and second superconducting terminals; and
   a conductive gate electrically coupled to the graphene channel,
   wherein the first terminal, the second terminal, and the graphene channel together form a Josephson junction having an oscillation frequency for the tunable oscillator, and wherein the conductive gate is configured such that application of a voltage it changes the oscillation frequency by changing resistance in the graphene channel.

2. The tunable oscillator of claim 1, wherein a gap between the first terminal and the second terminal has a length greater than 100 nm and less than 1000 nm.

3. The tunable oscillator of claim 2, wherein the gap has a width greater than 0.5 microns and less than 10 microns.

4. The tunable oscillator of claim 1, further comprising a first bias circuit connected to the first terminal and the second terminal and configured to drive a bias current through the Josephson junction.

5. The tunable oscillator of claim 4, wherein the Josephson junction has a critical current, and the bias current is greater than the critical current and less than 1.2 times the critical current.

6. The tunable oscillator of claim 1, further comprising a graphene sandwich comprising:
   a first layer of hexagonal boron nitride immediately adjacent a first surface of the graphene sheet,
   the graphene sheet, and
   a second layer of hexagonal boron nitride immediately adjacent a second surface of the graphene sheet.

7. The tunable oscillator of claim 6, wherein the conductive gate is directly on the graphene sandwich.

8. The tunable oscillator of claim 6, further comprising a gate insulating layer directly on the graphene sandwich, the conductive gate being directly on the gate insulating layer.

9. The tunable oscillator of claim 8, wherein the gate insulating layer is composed of aluminum oxide.

10. The tunable oscillator of claim 6, further comprising a substrate, wherein the first terminal, the second terminal, and the graphene sandwich are on the substrate.

11. The tunable oscillator of claim 10, wherein the substrate is a silicon substrate.

12. The tunable oscillator of claim 1, wherein the graphene sheet consists of a single atomic layer of graphene.

13. The tunable oscillator of claim 1, wherein the graphene sheet comprises two atomic layers of graphene.

14. The tunable oscillator of claim 1, wherein the first superconducting terminal and the second superconducting terminal are composed of a material selected from the group consisting of niobium nitride, niobium titanium nitride, niobium diselenide, aluminum, niobium, niobium titanium, and lead.

15. The tunable oscillator of claim 1, further comprising a refrigerator configured to cool the graphene sheet to a temperature below 4 K.

16. The tunable oscillator of claim 15, wherein the refrigerator is a pulse tube refrigerator.

17. The tunable oscillator of claim 1, further comprising an antenna comprising a first conductor, and a second conductor,
   wherein:
   the first superconducting terminal is connected to the first conductor of the antenna, and
   the second superconducting terminal is connected to the second conductor of the antenna.

18. The tunable oscillator of claim 1, further comprising a quarter-wave open stub, connected to the first terminal.

19. The tunable oscillator of claim 18, further comprising a quarter-wave section of transmission line, connected to the second terminal.

* * * * *